(12) United States Patent
Xiao et al.

(10) Patent No.: US 8,969,108 B2
(45) Date of Patent: Mar. 3, 2015

(54) LIGHT EMITTING DIODE AND FORMING METHOD THEREOF

(75) Inventors: Deyuan Xiao, Shanghai (CN); Richard Rugin Chang, Shanghai (CN)

(73) Assignee: Enraytek Optoelectronics Co., Ltd., Shanghai (CN)

( * ) Notice: Subject to any disclaimer, the term of this patent is extended or adjusted under 35 U.S.C. 154(b) by 86 days.

(21) Appl. No.: 13/881,723

(22) PCT Filed: Feb. 10, 2011

(86) PCT No.: PCT/CN2011/070901
§ 371 (c)(1),
(2), (4) Date: Jul. 12, 2013

(87) PCT Pub. No.: WO2012/055186
PCT Pub. Date: May 3, 2012

(65) Prior Publication Data
US 2013/0292640 A1 Nov. 7, 2013

(30) Foreign Application Priority Data
Oct. 28, 2010 (CN) .......................... 2010 1 0523853

(51) Int. Cl.
*H01L 29/06* (2006.01)
*H01L 33/64* (2010.01)
(Continued)

(52) U.S. Cl.
CPC .......... *H01L 33/641* (2013.01); *H01L 33/0079* (2013.01); *H01L 21/2007* (2013.01); *H01L 33/007* (2013.01)
USPC ............................................ 438/26; 257/13

(58) Field of Classification Search
USPC ............................................... 438/26; 257/13
See application file for complete search history.

(56) References Cited

U.S. PATENT DOCUMENTS

| 7,491,565 | B2 | 2/2009 | Coman et al. |
| 8,039,869 | B2 | 10/2011 | Lester et al. |
| 2006/0255341 | A1* | 11/2006 | Pinnington et al. ............. 257/79 |

(Continued)

FOREIGN PATENT DOCUMENTS

| CN | 1262528 A | 8/2000 |
| CN | 1909190 A | 2/2007 |

(Continued)

OTHER PUBLICATIONS

International Search Report and Written Opinion issued by the State Intellectual Property Office, the P.R. China (in Chinese language) dated Jun. 9, 2011, for related International Application No. PCT/CN2011/070901; 10 pages.

(Continued)

*Primary Examiner* — Jami M Valentine
(74) *Attorney, Agent, or Firm* — Faegre Baker Daniels LLP

(57) ABSTRACT

A light emitting diode (LED) and a forming method thereof are provided. The method for forming the LED includes: providing a semiconductor substrate (20) and a sapphire substrate (30) respectively, wherein a first bonding layer (21) is formed on the silicon substrate (20), and a sacrificial layer (32), an LED die (33) and a second bonding layer (35) are formed in turn on the sapphire substrate (30); bonding the first bonding layer (21) and the second bonding layer (35); removing the sacrificial layer (32) and lifting off the sapphire substrate (30). The method increases the effective lighting area of the LED, improves heat radiation, and enhances lighting efficiency.

13 Claims, 3 Drawing Sheets

(51) Int. Cl.
*H01L 33/00* (2010.01)
*H01L 21/20* (2006.01)

(56) References Cited

U.S. PATENT DOCUMENTS

2008/0096365 A1* 4/2008 Chitnis .................. 438/455
2008/0251798 A1 10/2008 Ogihara et al.

FOREIGN PATENT DOCUMENTS

CN 101005110 A 7/2007
CN 101964385 A 2/2011
JP 2009099675 A 5/2009

OTHER PUBLICATIONS

English translation of the International Search Report issued by the State Intellectual Property Office, the P.R. China. dated Jun. 9, 2011, for related International Application No. PCT/CN2011/070901; 5 pages.

* cited by examiner

LIGHT EMITTING DIODE AND FORMING METHOD THEREOF

CROSS-REFERENCE TO RELATED APPLICATIONS

The present application is a Section 371 National Stage Application of International Application No. PCT/CN2011/070901, filed on Feb. 10, 2011, which claims priority to Chinese patent application No. 201010523853.5, filed on Oct. 28, 2010, and entitled "LIGHT EMITTING DIODE AND FORMING METHOD THEREOF", and the entire disclosure of which is incorporated herein by reference.

FIELD OF THE DISCLOSURE

The present disclosure generally relates to semiconductor lighting field, and more particularly, to a light emitting diode and a forming method thereof.

BACKGROUND OF THE DISCLOSURE

A semiconductor Light Emitting Diode (LED) is a solid semiconductor light emitting device, which uses a solid semiconductor chip as a light emitting material and releases surplus energy by means of recombination of charge carriers, thus leading to photon emission and directly generating light like red, yellow, blue, green, cyan, orange and purple light.

According to emitting colors, LED can be divided into two groups, monochrome LED and white light LED. In the 1980s, a super high brightness red LED was invented. The early red LED was grown on a light absorption substrate and its light emitting efficiency was 1-2 lumens/watt. Later, improvements are made to the red LED by using a transparent substrate. Among all the super high brightness red LEDs, the best model had a light emitting efficiency of about 9 lumens/watt, with its emitting wavelength about 640 nm and drive current ranging from 30 mA to 50 mA. When given a voltage of 1.5V, the best model emitted gloomy light. Afterwards, a high-efficiency red LED, a high-efficiency orange-red LED and a high-efficiency orange LED formed on a gallium phosphide (GaP) substrate were developed. And a high brightness orange-red LED, a high brightness orange LED and a high brightness yellow LED were developed. The first green LED was formed by using gallium phosphide, which had a light emitting efficiency of tens of lumens per watt and the maximum drive current of 30 mA. Afterwards, a high-efficiency green LED and a green LED emerged. The first high-brightness wide-waveband gallium nitride (GaN) blue LED was successfully developed by Nichia in the 1990s, which had an optical spectrum spanning areas of purple, blue and green, and had a peak width of 450 nm. The first high brightness silicon carbide (SiC) blue LED was successfully developed by Cree in the 1990s. The first high brightness silicon carbide blue LED had a very wide optical spectrum range, and more particularly, had a large intensity in an optical spectrum range from mid-blue to purple. The peak width of the first high brightness silicon carbide blue LED ranged from 428 nm to 430 nm and the maximum drive current was about 30 mA, generally, 10 mA was used.

FIG. 1 schematically illustrates a structure of a monochrome LED in the existing methods. Hereinafter, a blue LED is taken as an example. Referring to FIG. 1, a buffer layer 11 made of n-doped gallium nitride (n-GaN) is formed on a sapphire substrate ($Al_2O_3$) 10; a multi-quantum well active layer 12 made of indium gallium nitride (InGaN) is formed on the buffer layer 11 and a cap layer 13 made of p-doped gallium nitride (p-GaN) is formed on the multi-quantum well active layer 12. The buffer layer 11, the multi-quantum well active layer 12 and the cap layer 13 collectively form a LED die. Besides, a transparent metal contact layer 14 is formed on the cap layer 13. A positive electrode 15 is electrically connected to the cap layer 13. In order to expose the buffer layer 11, a groove 16 is formed extending through the metal contact layer 14, the cap layer 13, the multi-quantum well active layer 12 and the buffer layer 11. A negative electrode 17 is formed on the bottom of the groove 16 and is electrically connected to the buffer layer 11. Thus, a voltage can be applied to the LED die through the positive electrode 15 and the negative electrode 17 to cause the LED to emit light.

In the prior art, a sapphire substrate 10 is generally employed to form a LED. Since the material of the sapphire substrate 10 is insulative, it is necessary to form a groove 16 and expose a buffer layer 11 through a negative electrode 17. The groove 16 may reduce an effective emitting area of the LED.

SUMMARY

Embodiments of the present disclosure provide a LED and a forming method thereof. The forming method may increase an effective emitting area of the LED.

In an embodiment, a method for forming a LED may include steps of:

providing a semiconductor substrate;

forming a first bonding layer on the semiconductor substrate;

providing a sapphire substrate;

forming a sacrificial layer, a LED die and a second bonding layer successively on the sapphire substrate;

bonding the first bonding layer and the second bonding layer; and removing the sacrificial layer and peeling the sapphire substrate.

Optionally, the method for forming a LED may further include: forming a connection electrode on a surface of the LED die exposed from peeling the sapphire substrate.

Optionally, the sacrificial layer may have a thickness ranging from 10 nm to 50 nm.

Optionally, the sacrificial layer may be made of boron phosphide (BP).

Optionally, removing the sacrificial layer may include: removing the sacrificial layer through an etching process by employing a hydrochloric acid gas.

Optionally, a first buffer layer may be formed between the sapphire substrate and the sacrificial layer.

Optionally, the first buffer layer may be made of aluminum nitride (AlN).

Optionally, the first bonding layer may be made of palladium and the second bonding layer may be made of indium or silver.

Optionally, the first bonding layer may be made of palladium and the second bonding layer may be a laminated construction of indium and palladium or a laminated construction of silver and palladium.

Optionally, the first bonding layer may be made of palladium and the second bonding layer may be a single layer of indium or a laminated construction of indium and palladium. The bonding process of the first bonding layer and the second bonding layer may have a reaction temperature ranging from 180° C. to 220° C.

Optionally, a contact electrode layer may be formed between the second bonding layer and the LED die.

Optionally, the contact electrode layer may be made of titanium.

Optionally, the contact electrode layer may have a thickness ranging from 2 nm to 10 nm.

Optionally, the LED die may include a cap layer, an active layer and a second buffer layer which are formed successively on the sacrificial layer.

Optionally, the semiconductor substrate may be an n-doped silicon substrate.

In an embodiment, a LED may include:

a semiconductor substrate;

a bonding layer formed on a surface of the semiconductor substrate; and a LED die formed on a surface of the bonding layer.

Optionally, a connection electrode may be formed on a surface of the LED die.

Optionally, the bonding layer may be made of palladium indium alloy ($PdIn_3$) or palladium-silver (PdAg).

Optionally, a contact electrode layer may be formed between the bonding layer and the LED die.

Optionally, the contact electrode layer may be made of titanium.

Optionally, the contact electrode layer may have a thickness ranging from 2 nm to 10 nm.

Optionally, the LED die may include a buffer layer, an active layer and a cap layer which are formed successively on the bonding layer.

Optionally, the semiconductor substrate may be an n-doped silicon substrate.

Compared with the existing methods, the present disclosure may have following advantages.

In the method for forming a LED in the present disclosure, a semiconductor substrate and a sapphire substrate are provided respectively, where a first bonding layer is formed on the semiconductor substrate, and a sacrificial layer, a LED die and a second bonding layer are formed successively on the sapphire substrate; then the first bonding layer and the second bonding layer are bonded; the sacrificial layer is removed and the sapphire substrate is peeled so that the LED die is transferred onto the semiconductor substrate. Since the semiconductor substrate has a good electrical conductivity, one electrode of the LED die may be led out and a groove does not need to be formed. Therefore, the effective lighting area of the LED may be increased.

Furthermore, the semiconductor substrate may have a better thermal conductivity than the sapphire substrate. Transferring the LED die onto the semiconductor substrate may be benefit to heat radiation during a light emitting process and enhance the light emitting efficiency.

DETAILED DESCRIPTION OF THE DISCLOSURE

As described above, a conventional LED die is generally formed on a sapphire substrate. Since the material of the sapphire substrate is insulative, a groove needs to be formed on the LED die so that a connection electrode may be formed therein, thereby reducing an effective emitting area.

According to the present disclosure, both a semiconductor substrate and a sapphire substrate are provided. A first bonding layer is formed on the semiconductor substrate, and a sacrificial layer, a LED die and a second bonding layer are formed successively on the sapphire substrate. The first and second bonding layers are bonded together. Then the sacrificial layer is removed and the sapphire substrate is peeled so that the LED die is transferred onto the semiconductor substrate. Since the semiconductor substrate has an excellent electrical conductivity, one electrode of the LED die may be led out and a groove does not need to be formed. Therefore, an effective lighting area of the LED may be increased.

Besides, the semiconductor substrate may have a better thermal conductivity than the sapphire substrate. Transferring the LED die onto the semiconductor substrate facilitates heat radiation during light emitting and enhances a light emitting efficiency.

In order to clarify the objects, characteristics and advantages of the disclosure, embodiments of present disclosure will be described in detail in conjunction with accompanying drawings.

In the following description, for the purposes of explanation, numerous specific details are set forth in order to provide a thorough understanding of the present disclosure. It will be apparent, however, to those skilled in the art that the present disclosure may be practiced with other embodiments different from embodiments described below. Those skilled in the art can modify and vary the embodiments without departing from the spirit and scope of the present disclosure. The present disclosure will not be limited to the following embodiments.

Figure 1:
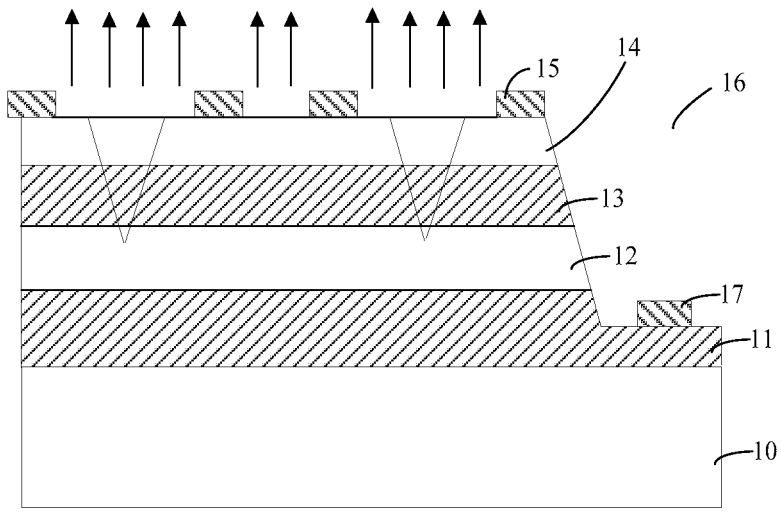
FIG. 1 schematically illustrates a sectional view of a LED in the prior art.
Figure 2:
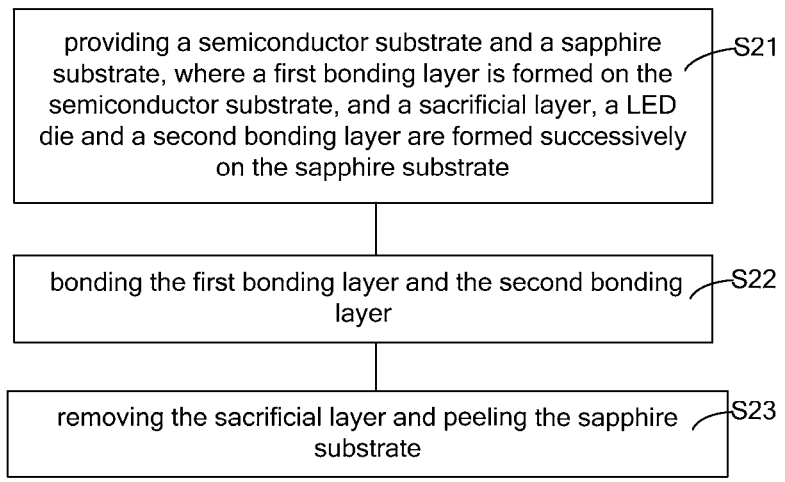
FIG. 2 schematically illustrates a flow chart of a method for forming a LED according to embodiments of the present disclosure.

FIG. 2 schematically illustrates a flow chart of a method for forming a LED according to embodiments of the present disclosure. The method may include steps of:

Step S21, providing a semiconductor substrate and a sapphire substrate, where a first bonding layer is formed on the semiconductor substrate, and a sacrificial layer, a LED die and a second bonding layer are formed successively on the sapphire substrate;

Step S22, bonding the first bonding layer and the second bonding layer; and

Step S23, removing the sacrificial layer and peeling the sapphire substrate.

The method for forming a LED according to embodiments of the present disclosure will be described in detail in conjunction with FIG. 2 to FIG. 6.

Figure 3:
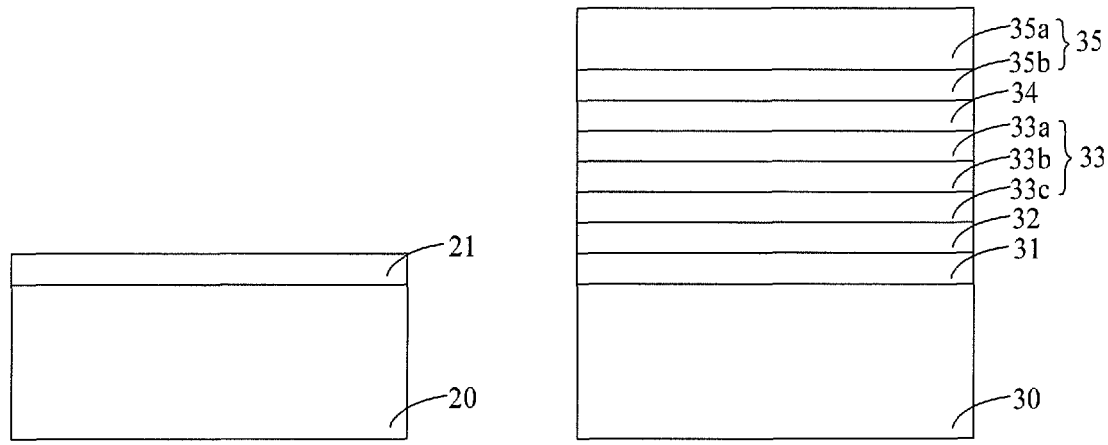
FIG. 3 to FIG. 6 schematically illustrate sectional views of intermediate structures corresponding to the method for forming a LED according to embodiments of the present disclosure.

Referring to FIG. 2 and FIG. 3, Step S21 is executed. In Step S21, both a semiconductor substrate and a sapphire substrate are provided. A first bonding layer is formed on the semiconductor substrate, and a sacrificial layer, a LED die and a second bonding layer are formed successively on the sapphire substrate.

Specifically, a semiconductor substrate 20 is provided, and a first bonding layer 21 is formed on a surface of the semiconductor substrate 20. The semiconductor substrate 20 is made of a semiconductor material, such as monocrystalline silicon, silicon, germanium, gallium arsenide or silicon germanium compounds. In some embodiments, the semiconductor substrate 20 may be an n-doped Si substrate and has a resistivity from $0.01\Omega\cdot cm$ to $0.1\Omega\cdot cm$. The first bonding layer 21 may be made of palladium. In a specific embodiment, the first bonding layer 21 made of palladium (Pd) may be formed on the surface of the semiconductor substrate 20 through a Physical Vapor Deposition (PVD) process. The first bonding layer 21 may have a thickness ranging from 80 nm to 120 nm, preferably 100 nm.

A sapphire substrate 30 is provided. The sapphire substrate 30 is mainly made of $Al_2O_3$. A first buffer layer 31, a sacrificial layer 32, a LED die 33, a contact electrode layer 34 and a second bonding layer 35 are formed successively on a surface of the sapphire substrate 30. The first buffer layer 31 is configured to buffer stress and match lattice between the sapphire substrate 30 and the sacrificial layer 32, thereby improving adhesion therebetween. In some embodiments, the sacrificial layer 32 may be made of boron phosphide (BP), which may be formed through a Metal-Organic Chemical Vapor Deposition (MOCVD) process and have a thickness ranging from 10 nm to 50 nm. The first buffer layer 31 may be made of aluminum nitride (AlN), which may be formed through a MOCVD process and have a thickness ranging from 100 nm to 5000 nm.

The LED die 33 may include a cap layer 33c, an active layer 33b and a second buffer layer 33a which are formed successively on the sacrificial layer 32. The cap layer 33c may be made of p-doped gallium nitride. The active layer 33b may be a multi-quantum well active layer and made of indium gallium nitride. In other embodiments, the active layer 33b may be a single-quantum well active layer or other active layers known to those skilled in the art. The second buffer layer 33a may be made of n-doped gallium nitride. The cap layer 33c, the active layer 33b and the second buffer layer 33a may be formed through a MOCVD process.

The contact electrode layer 34 may be made of titanium (Ti), which may be formed through a PVD process and have a thickness from 2 nm to 10 nm, preferably 5 nm. The contact electrode layer 34 is mainly configured to improve electrical contact by reducing a contact resistance between the second bonding layer 35 and the LED die 33.

The second bonding layer 35 may be a single layer of indium (In) or silver (Ag), a laminated construction of indium and palladium or a laminated construction of silver and palladium. In some embodiments, the second bonding layer 35 may be a laminated construction, including a palladium film 35b and an indium film 35a which are formed successively on the contact electrode layer 34. The second bonding layer 35 may be formed through a PVD process. The palladium film 35b may have a thickness ranging from 80 nm to 120 nm, preferably 100 nm. The indium film 35a may have a thickness ranging from 0.8 μm to 1.2 μm, preferably 1 μm.

It should be noted, that the first buffer layer 31 or the contact electrode layer 34 may be formed optionally. In some embodiments, one of them or neither of them may be formed. For example, the sacrificial layer 32 may be directly formed on the sapphire substrate 30, and the second bonding layer 35 may be directly formed on the LED die 33.

Figure 4:
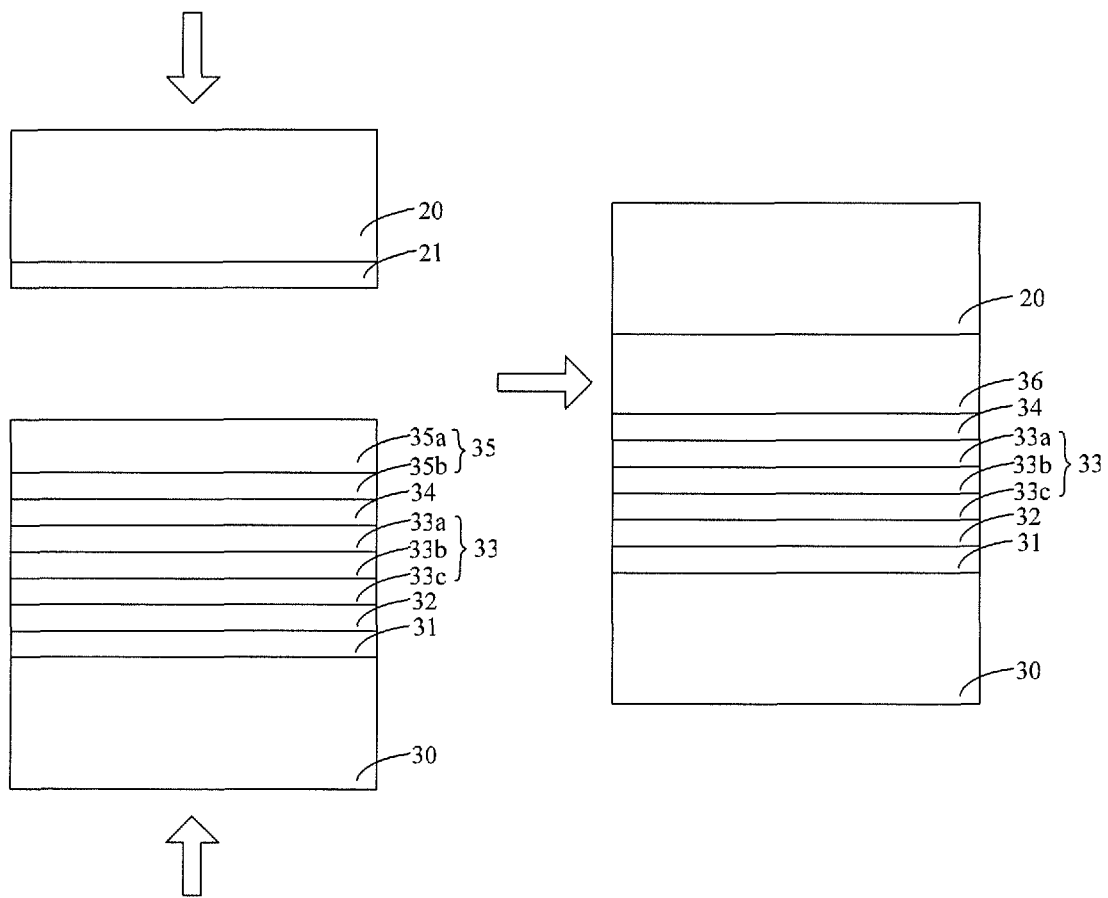

Referring to FIG. 2 and FIG. 4, Step S22 is executed. In Step S22, the first bonding layer and the second bonding layer are bonded. Specifically, the first bonding layer 21 and the second bonding layer 35 are bonded. Thus, the first bonding layer 21 reacts with the second bonding layer 35 to form a bonding layer 36. In some embodiments, as the first bonding layer 21 may be made of palladium and the second bonding layer 35 may include an indium film 35a and a palladium film 35b, the bonding layer 36 is made of palladium indium alloy (PdIn₃). The reaction temperature may range from 180° C. to 220° C., preferably 200° C. During the bonding process, plasma of nitrogen or other inert gasses may be fed in to reduce the reaction temperature and increase the bonding speed. In some embodiments, the second bonding layer 35 may be a single layer of indium and the reaction temperature may range from 180° C. to 220° C. Similarly, plasma of nitrogen or other inert gases may be fed in to reduce the reaction temperature.

Since the second bonding layer 35 is a laminated construction including the indium film 35a and the palladium film 35b, the indium film 35a is disposed between the palladium film 35b and the first bonding layer 21 made of palladium during the bonding process. The indium film 35a may react with the palladium film 35b and the palladium material in the first bonding layer 21 at the same time, thereby further increasing the reaction speed of the bonding process.

In some embodiments, the second bonding layer 35 may be made of a single layer of silver or a laminated construction of silver and palladium. The bonding layer 36 may be made of palladium-silver. The reaction temperature of silver and palladium may be higher than that of indium and palladium.

Figure 5:
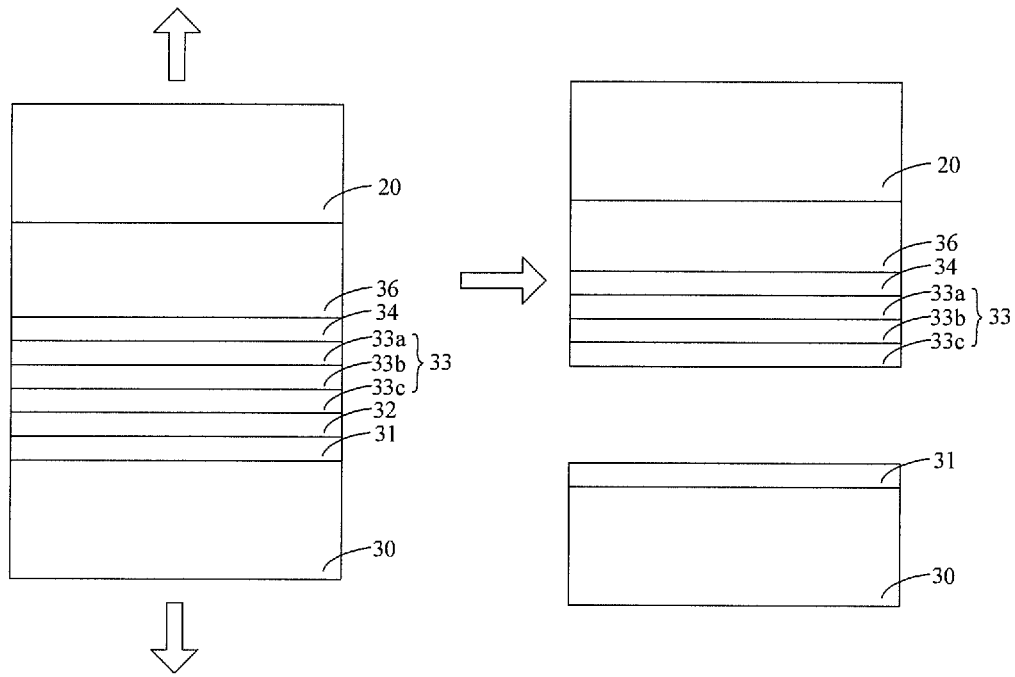

Referring to FIG. 2 and FIG. 5, Step S23 is executed. In Step S23, the sacrificial layer is removed and the sapphire substrate is peeled. Specifically, the sacrificial layer 32 is removed, and the sapphire substrate 30 and the first buffer layer 31 are peeled from the LED die 33. In some embodiments, the sacrificial layer 32 may be made of boron phosphide. The sacrificial layer 32 may be removed through a dry etching process by using a hydrochloric acid (HCl) gas. The etching process is selective, to have the sacrificial layer 32 removed and other layers not affected.

Based on the above steps, the LED die 33 is transferred from the sapphire substrate 30 onto the semiconductor substrate 20. One end of the LED die 33 is electrically connected to the semiconductor substrate 20 through the contact electrode layer 34 and the bonding layer 36. A negative voltage may be applied to the semiconductor substrate 20 as a negative electrode of the LED. The other end of the LED die 33 is exposed and a positive voltage can be applied to the other end directly to cause the LED die 33 to emit light. Therefore, there is no need for a groove specially to form an electrode, thus an effective light emitting area of the LED is increased. Besides, since the semiconductor substrate 20 has a much better thermal conductivity than the sapphire substrate 30, heat generated during light emitting may release through the semiconductor substrate 20 in time, thereby avoiding a decrease of a light emitting efficiency due to overheating and enhancing the light emitting efficiency of the LED.

A LED formed according to embodiments of the present disclosure may include: a semiconductor substrate 20; a bonding layer 36 formed on a surface of the semiconductor substrate 20; a contact electrode layer 34 formed on a surface of the bonding layer 36; a LED die 33 formed on a surface of the contact electrode layer 34. The contact electrode layer 34 is optional, namely, the LED die 33 may be formed directly on the surface of the bonding layer 36.

Figure 6:
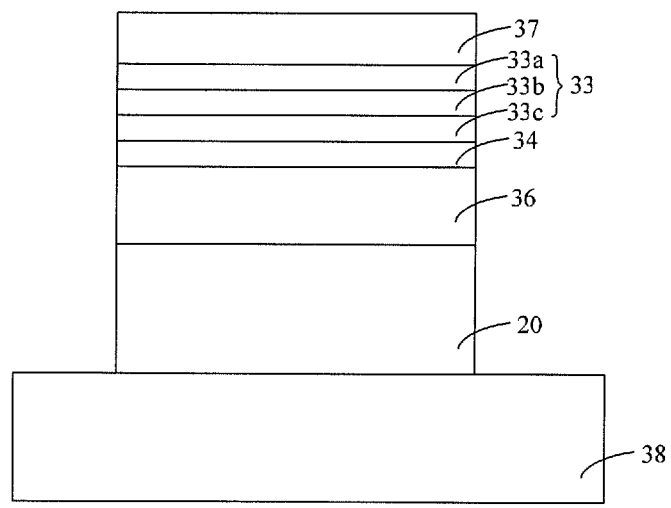

Referring to FIG. 6, following the peeling process, a connection electrode 37 may be formed on a surface of the LED die 33, which serves as a positive electrode. The connection electrode 37 may be made of gold (Au), nickel (Ni) or other materials known to those skilled in the art. Furthermore, the semiconductor substrate 20 may be fixed on an interconnection substrate 38. The interconnection substrate 38 may be made of aluminum or other conductive metals so that the semiconductor substrate 20 is electrically connected to the interconnection substrate 38. In practice, multiple LEDs and corresponding peripheral circuits may be connected together on the interconnection substrate 38 to form a light emitting array.

Therefore, based on FIG. 5, the LED formed according to the embodiments of the present disclosure may further include: a connection electrode 37 formed on the LED die 33 and an interconnection substrate 38 electrically connected to the semiconductor substrate 20.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A method for forming a light emitting diode, comprising:
   providing a semiconductor substrate;
   forming a first bonding layer on the semiconductor substrate;
   providing a sapphire substrate;
   forming a sacrificial layer, a light emitting diode die and a second bonding layer successively on the sapphire substrate;
   bonding the first bonding layer and the second bonding layer; and
   removing the sacrificial layer and peeling the sapphire substrate.

2. The method according to claim 1, further comprising:
   forming a connection electrode on a surface of the light emitting diode die exposed from peeling the sapphire substrate.

3. The method according to claim 1, wherein the sacrificial layer has a thickness ranging from 10 nm to 50 nm and is made of boron phosphide.

4. The method according to claim 3, removing the sacrificial layer comprising:
   removing the sacrificial layer through an etching process by employing a hydrochloric acid gas.

5. The method according to claim 3, where a first buffer layer is formed between the sapphire substrate and the sacrificial layer.

6. The method according to claim 5, where the first buffer layer is made of aluminum nitride.

7. The method according to claim 1, where the first bonding layer is made of palladium and the second bonding layer is made of indium or silver.

8. The method according to claim 1, where the first bonding layer is made of palladium and the second bonding layer is a laminated construction of indium and palladium or a laminated construction of silver and palladium.

9. The method according to claim 1, where the first bonding layer is made of palladium and the second bonding layer is a single layer of indium or a laminated construction of indium and palladium, where the bonding process of the first bonding layer and the second bonding layer has a reaction temperature ranging from 180° to 220°.

10. The method according to claim 1, where a contact electrode layer is formed between the second bonding layer and the light emitting diode die.

11. The method according to claim 10, where the contact electrode layer is made of titanium and has a thickness ranging from 2 nm to 10 nm.

12. The method for forming a light emitting diode according to claim 1, where the light emitting diode die comprises a cap layer, an active layer and a second buffer layer which are formed successively on the sacrificial layer.

13. The method for forming a light emitting diode according to claim 12, where the semiconductor substrate is an n-doped silicon substrate.

* * * * *